United States Patent [19]

Mathur et al.

[11] Patent Number: 4,661,204
[45] Date of Patent: Apr. 28, 1987

[54] METHOD FOR FORMING VERTICAL INTERCONNECTS IN POLYIMIDE INSULATING LAYERS

[75] Inventors: Vishnu Mathur; Socorro Garcia, both of San Jose, Calif.

[73] Assignee: Tandem Computers Inc., Cupertino, Calif.

[21] Appl. No.: 791,240

[22] Filed: Oct. 25, 1985

[51] Int. Cl.[4] .............................................. B44C 1/22
[52] U.S. Cl. .................................. 156/656; 29/576 R; 29/576 J; 156/629; 156/638; 156/643; 156/644; 156/653; 156/666.1
[58] Field of Search ............... 156/643, 654, 656, 657, 156/666.1, 638, 629, 644, 653; 29/576 R, 576 J

[56] References Cited

U.S. PATENT DOCUMENTS

| | | | |
|---|---|---|---|
| 4,377,438 | 3/1983 | Moriya et al. | 156/643 |
| 4,495,220 | 1/1985 | Wolf et al. | 156/644 X |
| 4,502,914 | 3/1985 | Trumpp et al. | 156/643 |
| 4,502,916 | 3/1985 | Umezaki et al. | 156/643 |
| 4,523,976 | 6/1985 | Bukhman | 156/643 |

OTHER PUBLICATIONS

A. C. Adams & C. D. Capio, (1981) J. Electrochem. Soc. 128:423-429.

Primary Examiner—Robert Lindsay
Attorney, Agent, or Firm—Townsend & Townsend

[57] ABSTRACT

A method for forming multiple metallization layers on a semiconductor wafer comprises applying insulating polyimide layers between adjacent metallization layers. Vertical interconnect holes are formed through the polyimide insulating layers using a positive photoresist mask. The vertical interconnect holes are etched using a fluorocarbon- or fluorosilicon-oxygen plasma under power and temperature conditions which provide for selectively etching the polyimide relative to the photoresist. By initially forming the plasma etch at high power conditions which reduce the selectivity for the polyimide, the upper portion of the vertical interconnect hole walls may be flared to reduce problems with step metallization. The remaining portion of the plasma etch, however, is performed under conditions which are more highly selective for the polyimide which provides for better dimensional control and eliminates formation of a contaminating layer at the bottom of the vertical interconnect hole.

14 Claims, 7 Drawing Figures

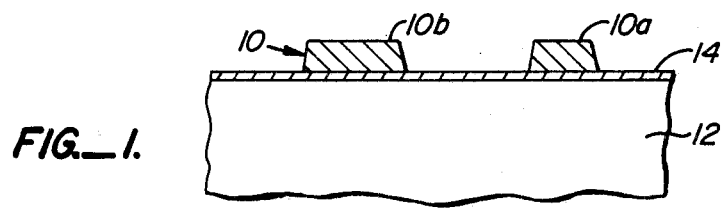
FIG._1.
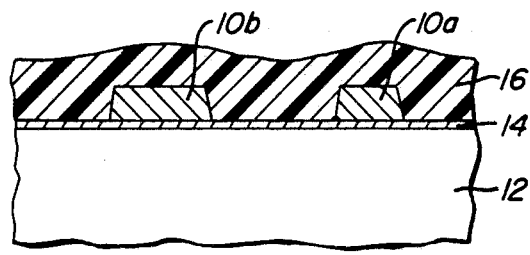
FIG._2.
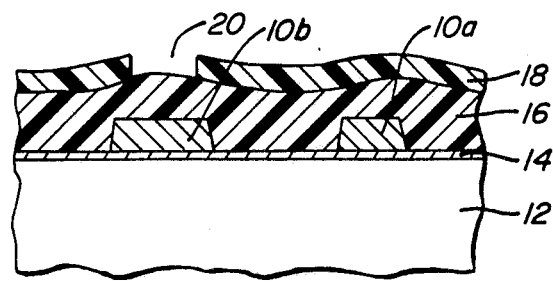
FIG._3.
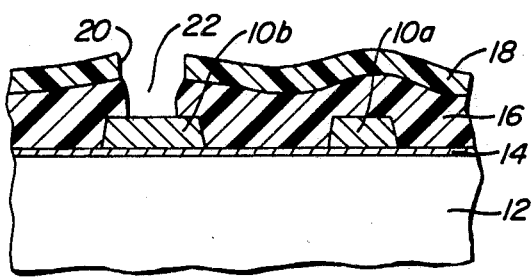
FIG._4.

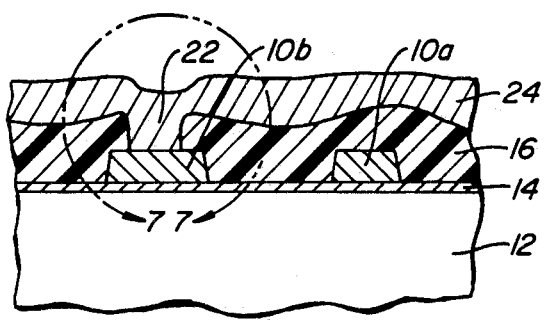
FIG._5.
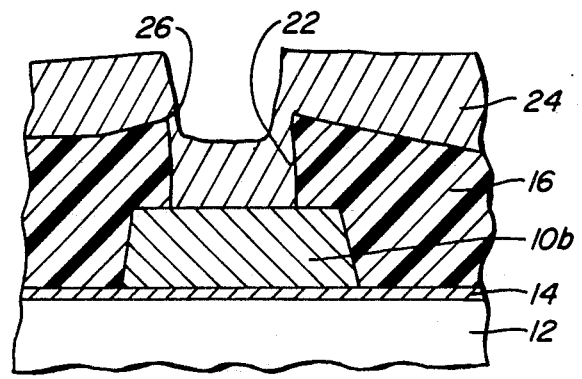
FIG._6.
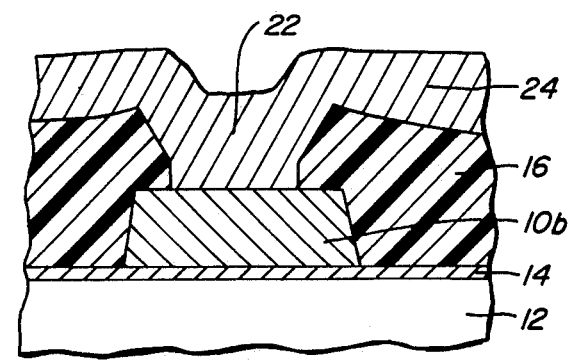
FIG._7.

METHOD FOR FORMING VERTICAL INTERCONNECTS IN POLYIMIDE INSULATING LAYERS

BACKGROUND OF THE INVENTION

1. Field of the Invention

The present invention relates generally to the fabrication of semiconductor devices, and more particularly to a method for forming vertical interconnects between adjacent metal layers which are separated by polyimide insulating layers.

Semiconductor fabrication requires the formation and patterning of conductive metallization layers, typically aluminum or aluminum silicon, to define interconnections between various circuit elements formed in the device substrate. For products having a high density of such circuit elements, such as very large scale integration (VLSI) products, it is normally necessary to form two or more metallization layers which are vertically spaced apart and separated by intermediate insulating layers. The insulating layers are usually formed from silicon dioxide, although the use of polyimide insulating layers offers a number of advantages and is finding increasing use. The present invention concerns the formation of multiple metallization layers having intermediate polyimide insulating layers.

One problem encountered in the formation of multiple metallization layers results from the propagation of surface irregularities. The patterning of each metallization layer results in an uneven surface whose contours are imparted to the overlying insulating layer. The primary advantage of polyimide insulating layers over silicon dioxide insulating layers is that the polyimide layers smooth over the irregularities of the underlying metallization layers, providing a superior surface for applying additional metallization layers, and the like. The polyimide insulating layers are also free from discontinuities, such as small holes, which are frequently found in silicon dioxide insulating layers.

The polyimide insulating layers, however, suffer from certain drawbacks related to the formation of holes for the vertical interconnects or vias which are required to electrically connect the vertically spaced apart metallization layers. Because of the generally slower or compatible etch rate of polyimides relative to the photoresist materials, it has been difficult to form the vertical interconnect holes by conventional photolithographic techniques. To overcome this problem, it has been necessary to form an intermediate hard layer, typically silicon dioxide or aluminum, between the polyimide layer and the photoresist layer. The photoresist is then used to pattern the hard layer by conventional techniques, and the patterned hard layer is then used as the mask for forming the vertical interconnects. The intermediate hard layer then must be removed prior to applying the next metallization layer. Although workable, this method is cumbersome and it would be desirable to provide a method for etching the vertical interconnect holes directly without requiring the formation of an intermediate masking layer.

In addition to being cumbersome, the method just described has an additional drawback. The use of an oxygen plasma to etch the polyimide layer through the hard layer mask causes the formation of concave walls of the vertical holes in the polyimide layer. Such concave walls can create breaks in the step coverage in the overlying metallization layers. It would therefore be desirable to provide a method for forming the vertical holes which results in straight walls or walls which diverge in the upward direction.

2. Description of the Background Art

Adams and Capio (1981) J. Electrochem. Soc. 128:423-429 describe a method for planarizing a phosphorous-doped silicon dioxide insulating layer by applying a layer of photoresist over the silicon dioxide to define a smooth surface and then sputter etching the combined layers under conditions which etch the photoresist in the silicon dioxide at the same rate. U.S. Pat. No. 4,377,438 to Moriya et al. describe the planarization of a silicon nitride insulating layer using a fluorocarbon and hydrogen plasma etch.

SUMMARY OF THE INVENTION

According to the present invention, a positive photoresist mask is used directly to plasma etch a polyimide insulating layer to form vertical interconnect holes therein. It has been found that the use of fluorocarbon- or fluorosilicon-oxygen plasmas provides sufficient selectivity for the polyimide material relative to the photoresist to allow formation of the vertical interconnects before the photoresist layer is depleted. Furthermore, it has been found that by the use of such etchants without an intermediate hard masking layer, the concave shape of the interconnect walls is avoided and the reliability of the overlying metallization layers is improved.

Specifically, the method of the present invention comprises the application of a positive photoresist layer directly over the polyimide insulating layer. The thickness of the photoresist layer will be greater than or equivalent to that of the polyimide layer, and the photoresist layer will be patterned by conventional photolithographic techniques to provide the desired pattern of vertical interconnect holes. The vertical interconnect holes are then etched with a fluorocarbon- or fluorosilicon-oxygen plasma under pressure and power conditions such that the etch ratio of the polyimide to the photoresist is at least 2:1. The ratio of fluorocarbon or fluorosilicon to oxygen in the plasma will be in the range from about 1:2 to 2:1 by volume, usually being about 1:1 by volume. Usually, the plasma etch will first be carried out at a high etch rate, followed by a lower etch rate. It has been found that this combination provides for accurate dimensional control of the vertical interconnects without an unacceptable increase in processing time. Moreover, the lower etch rate at the end of the etch cycle reduces the amount of contaminants which collect at the bottom of the hole. Contaminants, of course, are undesirable since they might interfere with electrical contact with the underlying metallization. The preferred fluorocarbons and fluorosilicons are $CF_4$, $C_2F_6$, and $SF_6$.

The method for forming the vertical interconnects is generally performed as part of a method for forming multiple metallization layers on a semiconductor substrate. A first metallization layer is formed and patterned by conventional techniques, followed by applying a polyimide layer thereover. The vertical interconnects are formed in the polyimide insulating layer by the method of the present invention, as just described, and a second metallization layer is then formed over the polyimide insulating layer. Subsequent polyimide insulating layers and metallization layers may be applied by simply repeating the step just described.

BRIEF DESCRIPTION OF THE DRAWINGS

FIG. 1 illustrates a semiconductor substrate having a first metallization layer formed thereon.

FIG. 2 illustrates a polyimide layer formed over the metallization layer of the substrate of FIG. 1.

FIG. 3 illustrates a patterned photoresist layer formed over the polyimide layer of FIG. 2.

FIG. 4 illustrates a vertical interconnect hole formed by the method of the present invention in the polyimide layer.

FIG. 5 illustrates a second metallization layer formed over the polyimide layer and extending through the vertical interconnect of FIG. 4.

FIG. 6 is a detail view illustrating the vertical walls formed by use of a slow etch rate.

FIG. 7 is a detail view taken along line 7—7 in FIG. 5.

DESCRIPTION OF THE PREFERRED EMBODIMENT

Referring to FIG. 1, a first metallization layer 10 is formed over a semiconductor substrate 12 by conventional photolithographic techniques. The substrate 12 is part of a silicon wafer which has been processed by conventional techniques to produce a plurality of individual dies or chips. In general, the entire wafer will be subjected to the processing steps which are described hereinafter. The drawings, however, illustrate only a small portion of the wafer substrate.

A passivation layer 14, typically silicon dioxide formed by thermal oxidation to a thickness of about 1.0 to 1.5 μm, is formed directly over the substrate 12 to isolate the first metallization layer 10. The metallization layer 10 is then formed by evaporative deposition of a conductive metal, typically aluminum or aluminum silicon, to a thickness in the range from about 0.5 to 1.5 μm. The metallization layer 10 is then patterned by conventional lithographic techniques to form a plurality of individual interconnect lines, two of which (10a and 10b) are illustrated in FIG. 1. The interconnect lines connect various circuit elements previously defined in the semiconductor substrate 12 by well known techniques.

The present invention is directed at a method for applying one or more additional metallization layers over the first metallization layer 10. To form these additional metallization layers, it will be necessary to provide insulating layers between the adjacent metallization layers, as well as to further provide vertical interconnects through the insulation layers connecting the metallization layers with either the underlying substrate or with other metallization layers. The method for forming such additional metallization layers is illustrated in FIGS. 2-5.

Referring now to FIG. 2, a first insulation layer 16 is applied directly over the first metallization layer 10. The insulating layer 16 is a polyimide layer formed by spinning polyamic acid onto the substrate 12 over the metallization layer 10 to a desired thickness. The thickness is usually in the range from about 1.5 to 3.0 μm. Normally, an adhesion promoter will be first applied over the metallization layer 10 and oxidation layer 14 prior to applying the polyamic acid. After spinning, the polyamic acid is polymerized at an elevated temperature to produce the polyimide layer. The film is first treated at a lower temperature, typically about 150° C. for about 30 minutes, to remove excess solvents. The film is then treated at a higher temperature, typically at 350° C. for about 60 minutes followed by treatment at 450° C. for about 10 minutes to produce a fully cured polyimide film having a thickness in the range from about 0.8 to 2.5 μm.

Suitable polyimides are available from commercial suppliers, such as Hitachi Chemical Co. and DuPont de Nemours. Particularly preferred is DuPont liquid polyamic acid PI-2555 which is diluted 4:1 with thinner T-9035. The thinned polyamic acid may be applied by spinning at 500 rpm for about 3 seconds, followed by a faster spin speed until the desired polyimide thickness is obtained. It should be noted that the polyimide film thickness decreases by approximately 40 to 50% during the high temperature cure operation, and that the loss in thickness should be taken into account in determining the initial thickness of the film. Suitable adhesion promoter is VM-651 also available from DuPont. The adhesion promoter is used at a concentration of about 0.1 to 0.1 weight percent in a 95/5% mixture of methanol water. The promoter is applied to the wafer substrate by spinning at 5000 rpm for about 30 seconds.

After the polyimide has been applied and cured, a photoresist layer 18 (FIG. 3) is applied over the polyimide layer 16. The thickness of the photoresist layer 18 (typically in the range from 2.0 to 3.0 μm) must be greater than that of the polyimide layer 16 so that the photoresist layer is not depleted prior to the completion of the etching of the vertical interconnects in subsequent processing steps. Exposure holes 20 in the photoresist layer 18 are formed by exposing and developing the photoresist layer using well known techniques. The locations of the exposure holes 20 correspond to the desired locations of the vertical interconnects in the polyimide layer 16.

Once the exposure holes 20 are formed, the wafers are etched in a fluorocarbon- or fluorosilicon-oxygen plasma under pressure and power conditions selected to provide an etch ratio of the polyimide to the photoresist of at least about 2:1. In this way, since the photoresist layer is at least as thick as the polyimide layer, it is assured that the vertical connect holes will be fully formed prior to the depletion of the photoresist layer. In the preferred embodiment, a 2.5 μm layer of AZ 1450J positive photoresist available from Shipley, is applied over the polyimide. After exposure, the photoresist is developed in a 5:1 mixture of AZ 351 developer, also available from Shipley.

Referring now to FIG. 4, vertical connect holes 22 are etched in the polyimide layer 16 by plasma etching. The plasma is a mixture of a fluorocarbon or fluorosilicon and oxygen at a ratio in the range from about 1:2 to 2:1 by volume, usually about 1:1 by volume. In the preferred embodiment, the plasma etching may be performed in a parallel plate reactor using a $CF_4$-$O_2$ plasma (1:1 volume ratio) at a pressure of about 0.150 torr. The etching is carried out in two steps. In the first step, the etch is carried out at a relatively high power in the range from about 250 to 350 watts, typically about 300 watts. The high power provides a lower polyimide to photoresist selectivity so that a greater amount of photoresist is etched than would otherwise be the case. This, in turn, provides a greater taper at the top of the vertical interconnect holes since the diameter of the exposure hole 20 in the photoresist layer 18 is increasing at a greater rate. After the polyimide etch is partially complete, usually about 80% complete, the remaining etch is carried out at a lower power in the range from 50 to 150 watts, typically about 100 watts. Such lower power provides a greater selectivity for the polyimide layer, allowing for better dimensional control. Thus, the lower portion of wall 22 will have a lesser inclination than at the top. The profile of the resulting interconnect hole 22 is best seen in FIG. 7.

Referring now to FIG. 5, after the vertical interconnect hole 22 has been formed, the photoresist layer 18 is removed and a second metallization layer 24 applied over the polyimide layer 16. It will be appreciated that additional metallization layers may be applied over the second metallization layer 24 by repeating the steps described in connection with FIGS. 2-5 herein.

The advantages of the two stage etch may be observed in reference to FIGS. 6 and 7. FIG. 6 illustrates the case where the etch is performed entirely at a lower power setting, providing for relatively steep walls for the vertical interconnect 22. The second metallization layer 24 applied over the polyimide insulation layer 16 may suffer from thin areas or breaks 26 because of the abrupt drop-off into the vertical interconnect hole 22. In contrast, the tapered walls provided by the two-step plasma etch just described allow for a much smoother profile of the overlying metallization layer 24, as illustrated in detail in FIG. 7.

Although the foregoing invention has been described in some detail by way of illustration and example for purposes of clarity of understanding, it will be obvious that certain changes and modifications may be practiced within the scope of the appended claims.

What is claimed is:

1. A method for forming vertical interconnect holes in a polyimide layer on a semiconductor substrate, said method comprising:
   applying a positive photoresist layer having a thickness greater than the polyimide layer directly over the polyimide layer;
   exposing and developing the photoresist layer in a predetermined pattern corresponding to the desired pattern of vertical holes in the polyimide layer; and
   etching the vertical holes with a fluorocarbon- or fluorosilicon-oxygen plasma under pressure and power conditions selected to provide an etch ratio of the polyimide to the photoresist is at least 2:1.

2. A method as in claim 1, wherein the etching is first carried out at a high etch rate and thereafter at a lower etch rate.

3. A method as in claim 2, wherein the plasma etch occurs in a parallel plate reactor at low pressure initially at a power level in the range from 250 to 350 watts and thereafter at a power level in the range from 50 to 150 watts.

4. A method as in claim 1, wherein fluorocarbon or fluorosilicon plasma is selected from the group consisting of $CF_4$, $C_2F_6$, and $SF_6$.

5. A method as in claim 1, wherein the volume ratio of fluorocarbon or fluorosilicon to oxygen in the plasma is in the range from 2:1 to 1:2.

6. A method as in claim 5, wherein the volume ratio of fluorocarbon or fluorosilicon to oxygen ratio in the plasma is about 1:1.

7. A method for forming multiple metallization layers on a semiconductor substrate, said method comprising:
   forming a first metallization layer having a predefined interconnect pattern on the substrate;
   applying a first polyimide insulating layer over the first metallization layer;
   applying a positive photoresist layer having a thickness greater than the polyimide layer directly over the first polyimide insulating layer;
   exposing and developing the photoresist layer in a predetermined pattern corresponding to a desired pattern of vertical interconnects through the insulating layer;
   etching vertical holes through the polyimide insulating layer with a fluorocarbon- or fluorosilicon-oxygen plasma under pressure and power conditions such that the etch ratio of the polyimide to the photoresist is at least 2:1; and
   forming a second metallization layer having a predefined interconnect pattern over the first polyimide insulating layer.

8. A method as in claim 7, wherein the first polyimide layer is applied by spinning and curing polyamic acid to a final thickness in the range from 0.8 to 2.5 $\mu$m.

9. A method as in claim 7, wherein the positive photoresist layer is applied by spinning to a thickness in the range from 2.0 to 3.0 $\mu$m.

10. A method as in claim 7, wherein the etching is first carried out at a high etch rate and thereafter at a low etch rate.

11. A method as in claim 10, wherein the plasma etch occurs in a parallel plate reactor at low pressure initially at a power level in the range from 250 to 350 watts and thereafter at a power level from 50 to 150 watts.

12. A method as in claim 7, wherein the fluorocarbon- or fluorosilicon-oxygen plasma is selected from the group consisting of $CF_4$, $C_2F_6$, and $SF_6$.

13. A method as in claim 7, wherein the volume ratio of fluorocarbon or fluorosilicon to oxygen in the plasma is in the range from 2:1 to 1:2.

14. A method as in claim 13, wherein the volume ratio of fluorocarbon or fluorosilicon to oxygen ratio in the plasma is about 1:1.

* * * * *